United States Patent
Lin et al.

(10) Patent No.: US 9,356,128 B2
(45) Date of Patent: May 31, 2016

(54) SEMICONDUCTOR POWER DEVICE

(71) Applicants: EPISTAR CORPORATION, Hsinchu (TW); HUGA OPTOTECH INC., Taichung (TW)

(72) Inventors: Heng-Kuang Lin, Taichung (TW); Yih-Ting Kuo, Taichung (TW); Tsung-Cheng Chang, Taichung (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/256,733

(22) Filed: Apr. 18, 2014

(65) Prior Publication Data
US 2015/0048418 A1     Feb. 19, 2015

(30) Foreign Application Priority Data
Aug. 16, 2013   (TW) .............. 102129615 A

(51) Int. Cl.
| | |
|---|---|
| *H01L 29/778* | (2006.01) |
| *H01L 29/20* | (2006.01) |
| *H01L 29/207* | (2006.01) |
| *H01L 21/02* | (2006.01) |
| *H01L 21/20* | (2006.01) |
| *H01L 29/66* | (2006.01) |
| *H01L 29/10* | (2006.01) |

(52) U.S. Cl.
CPC .......... *H01L 29/778* (2013.01); *H01L 29/1075* (2013.01); *H01L 29/2003* (2013.01); *H01L 29/66462* (2013.01); *H01L 29/7787* (2013.01)

(58) Field of Classification Search
CPC ............... H01L 21/02381; H01L 21/02458; H01L 21/02507; H01L 21/0254; H01L 29/205; H01L 29/7787; H01L 29/155; H01L 29/2003; H01L 29/152; H01L 21/0262
USPC ............... 257/76, 15, 194, 22, 190, E29.246, 257/E29.089; 136/255, 47, 481, 602
See application file for complete search history.

(56) References Cited

U.S. PATENT DOCUMENTS

| | | | |
|---|---|---|---|
| 2008/0200013 A1* | 8/2008 | Piner et al. .................... 438/479 |
| 2009/0008647 A1* | 1/2009 | Li et al. ............................ 257/76 |
| 2011/0220190 A1* | 9/2011 | Lee et al. ....................... 136/255 |
| 2011/0272665 A1* | 11/2011 | Yamaguchi et al. ............ 257/12 |
| 2012/0223365 A1* | 9/2012 | Briere ........................... 257/194 |
| 2013/0334495 A1* | 12/2013 | Lim et al. ........................ 257/15 |
| 2014/0305498 A1* | 10/2014 | Liu et al. ....................... 136/255 |
| 2014/0353587 A1* | 12/2014 | Hoteida et al. .................. 257/22 |

* cited by examiner

*Primary Examiner* — Kimberly Rizkallah
*Assistant Examiner* — Brian Turner
(74) *Attorney, Agent, or Firm* — Ditthavong & Steiner, P.C.

(57) ABSTRACT

A semiconductor power device, comprising: a substrate; a first semiconductor layer with a first lattice constant formed on the substrate; a first grading layer formed on the first semiconductor layer and comprising a first portion; a second grading layer formed on the first grading layer; a second semiconductor layer with a second lattice constant formed on the second grading layer; a first interlayer formed in the first grading layer and adjacent to the first portion of the first grading layer; and a second interlayer formed in the second grading layer; wherein the first interlayer comprises a first superlattice including a series of $Al_{x1}Ga_{1-x1}N/Al_{y1}Ga_{1-y1}N$ alternate layers, $(x1-y1) \geq 0.2$, and the second interlayer comprises a second superlattice including a series of $Al_{x2}Ga_{1-x2}N/Al_{y2}Ga_{1-y2}N$ alternate layers, $(x2-y2) \geq 0.2$, wherein the average of x1 and y1 is larger than that of x2 and y2.

13 Claims, 7 Drawing Sheets

SEMICONDUCTOR POWER DEVICE

TECHNICAL FIELD

The present application relates to a semiconductor power device, especially relates to a semiconductor power device with an interlayer in the buffer layer.

DESCRIPTION OF BACKGROUND ART

Due to the demand of the semiconductor power device used for switch in high frequency, group III-V semiconductor materials, such as GaN, recently used for power device operated in high frequency develops rapidly. Because group III-V semiconductor materials are capable of forming a two-dimensional electron gas (2DEG) due to the piezoelectric effect in the junction, group III-V semiconductor materials with 2DEG has the advantages of outputting high electrical current concentration, low switching losing, and operating in high voltage with the characteristics of the high mobility of the electrons, high electrons concentration of 2DEG, and the low electrical resistance of GaN. Thus, group III-V semiconductor materials are suitable for power device.

Common power device comprises Bipolar Junction Transistor (BJT) and Field Effect Transistor (FET), wherein BJT turns on and off by controlling the bias voltage of the two pn-junctions thereof and has certain ratio of the output current to the input current, which is current gain. FET turns on and off by controlling the input signal to change the electrical field thereof and therefore the characteristic of the tunnel. Both BJT and FET have the breakdown voltage and leakage current issues when they adopt group III-V semiconductor materials to improve switch speed and efficiency. Especially, due to the lattice mismatch between the substrate and the following growth epitaxial material, the epitaxial quality such as the dislocation concentration of the epitaxial layer, significantly influences the value of the breakdown voltage and leakage current of BJT or FET.

SUMMARY OF THE DISCLOSURE

A semiconductor power device, comprising: a substrate; a first semiconductor layer with a first lattice constant formed on the substrate, wherein the first semiconductor layer comprises a first group III element; a first grading layer formed on the first semiconductor layer and comprising a first portion; a second semiconductor layer with a second lattice constant formed on the first grading layer, wherein the second semiconductor layer comprises a second group III element; and a first interlayer formed in the first grading layer and adjacent to the first portion of the first grading layer, wherein a composition of the first interlayer is different from that of the first portion, and the first grading layer comprises the first group III element and the second group III element, and concentrations of both the first group III element and the second group III element in the first grading layer are gradually changed.

DETAILED DESCRIPTION OF PREFERRED EMBODIMENTS

Figure 1A:
FIGS. 1A-1G show the manufacturing process in accordance with the first embodiment of the present application.
Figure 1B:
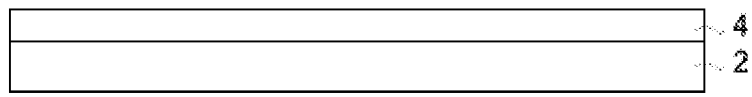
Figure 1C:
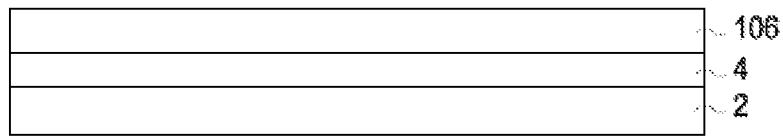
Figure 1D:
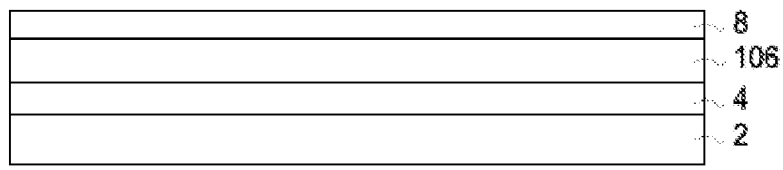
Figure 1E:
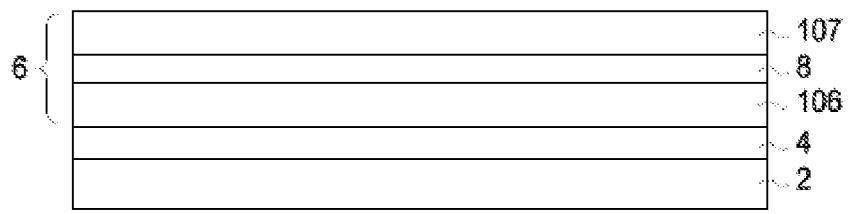

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

First Embodiment

Figure 1F:
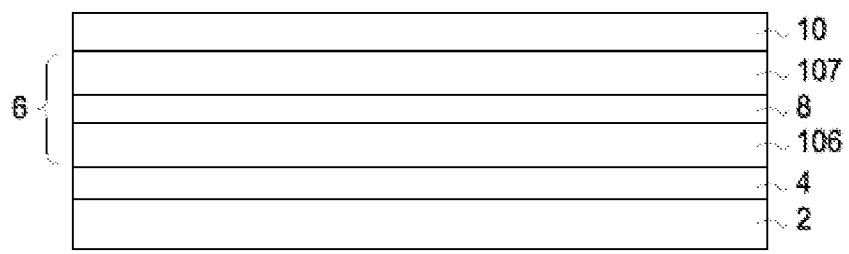
Figure 1G:

FIGS. 1A-1G show the manufacturing process in accordance with the first embodiment of the present application. As FIGS. 1A-1E show, firstly a semiconductor layer 4 is formed on a substrate 2, and then a first part 106 of a first grading layer 6 is formed on the semiconductor layer 4. After that, a first interlayer 8 is formed on the first part 106 of the first grading layer 6, and then a second part 107 of the first grading layer 6 is formed on the first interlayer 8. The first part 106 and the second part 107 of the first grading layer 6 have different lattice constant, and the first interlayer 8 comprises amorphous material. In the embodiment, the first part 106 and the second part 107 of the first grading layer 6 comprise the same chemical elements. After that, as FIG. 1F shows, a tunnel layer 10 is formed on the second part 107 of the first grading layer 6. In the embodiment, the tunnel layer 10 and the semiconductor layer 4 comprise different materials. And then, referring to FIG. 1G, an electron supplying layer 12 is formed on the tunnel layer 10. In the embodiment, the tunnel layer 10 and the electron supplying layer 12 are formed of the materials with different lattice constants. Due to the piezoelectric effect and polarization caused by the different lattice constants, a two-dimensional electron gas (2DEG) is formed in the tunnel layer 10 for increasing the efficiency of electron transportation. In the embodiment, the tunnel layer 10, the first grading layer 6, and the electron supplying layer 12 comprise group III-V elements, but the composition of the group III-V elements of the first interlayer 8 is different from that of the tunnel layer 10, the first part 106, the second part 107, or the electron supplying layer 12. In other embodiment, the first interlayer 8 is devoid of group III elements or group III elements which the first part 106 and the second part 107 comprise. In the embodiment, the thicknesses of the first part 106 and the second part 107 can be the same or different in accordance with the process conditions.

The material of the substrate 2 can be Sapphire, GaN, AlN or Si. In other embodiment, a portion of the substrate 2 can be removed to shorten the leakage current path of the semiconductor power device for reducing the leakage current when forming the semiconductor power device. The semiconductor layer 4 is formed on the substrate 2 as a buffer layer for reducing the lattice constant difference between the substrate 2 and the following growth epitaxial stack. In the embodiment, the material of the semiconductor layer 4 is AlN and formed on the surface of the substrate 2 formed of GaN. The first grading layer 6 formed on the semiconductor layer 4 comprises the first part 106, the second part 107, and the first interlayer 8 wherein the first layer 8 can be amorphous material, and the first part 106 and the second part 107 can be semiconductor material. Specifically, the first layer 8 comprises SiN, which can be amorphous material, and the first part 106 and the second part 107 are formed of AlGaN, which can be semiconductor material. In other words, the first part 106 and the second part 107 comprising group III-V elements are separated by the first layer 8 which comprises the composition of the group III-V elements different from that of the first part 106 or the second part 107. In other embodiment, the first layer 8 can cover a portion of the first part 106, which means that a portion of the first part 106 and the second part 107 contact directly without the first interlayer 8 therebetween. In that case, the first layer 8 is a patterned structure, which is periodic, semi-periodic or aperiodic, formed on the first part 106. The first part 106 and the second part 107 comprise the same characteristic of gradual change, which means the Al concentration of AlGaN of the first part 106 or the second part 107 decreases along the direction away from the substrate 2 and the Ga concentration of AlGaN of the first part 106 or the second part 107 increases along the direction away from the substrate 2. In other words, the concentration of Ga of the second part 107 is higher than that of the first part 106, and the Al concentration of the first part 106 is higher than that of the second part 107. From the energy bandgap point of view, the first part 106 has higher energy bandgap than that of the second part 107, and the bandgap decreases along the direction away from the substrate 2. Specifically, in the embodiment, the chemical formula of the AlGaN of the first part 106 can be $Al_{x1}Ga_{y1}N$, and that of the second part 107 can be $Al_{x2}Ga_{y2}N$, wherein $0<x2\le x1\le 1$ and $0<y1\le y2\le 1$. That is, the first part 106 and the second part 107 comprise different composition ratio of AlGaN in different position. To be more specific, the second part 107 comprises more Ga and less Al than the first part 106. In another embodiment, the compositions of AlGaN of the first part 106 and the second part 107 in the neighboring region can be the same. In other words, $Al_{x1}Ga_{y1}N$ of some portion of the first part 106 and $Al_2Ga_2N$ of some portion of the second part 107 can have the characteristics of x2=x1 and y1=y2. Since the Al concentration decreases along the direction away from the substrate 2 and the concentration of Ga increases along the direction away from the substrate 2 in both the first part 106 and the second part 107, if they have regions having the same compositions, such regions should be t closest to each other in the first part 106 and the second part 107. In other words, where the first part 106 and the second part 107 directly contact the first interlayer 8 should have the same chemical composition. In the embodiment, the second part 107 has larger lattice constant than that of the first part 106, the lattice constants of the first part 106 and the second part 107 are between the lattice constants of the tunnel layer 10 and the semiconductor layer 4, and the lattice constant of the first interlayer 6 is between the lattice constant of the semiconductor layer 4 and the lattice constant of the tunnel layer 10. In the embodiment, the first part 106 and the second part 107 of the first grading layer 6 comprise AlGaN. In another embodiment, the first part 106 and the second part 107 can also comprise AlInGaN.

As above mentioned, by forming the first interlayer 8 having the composition of group III-V materials different from those of adjacent semiconductor layers, the defects occurring in the adjacent the semiconductor layer, such as the first part 106, are barred by the first interlayer 8 from extending to the second part 107 so the defect density of the epitaxial layers is decreased effectively, the quality of the epitaxial layers is improved, and the issues of the leakage current and breakdown voltage of the power device made of the epitaxial layers are further improved. The stack of the tunnel layer 10 and the electron supplying layer 12 are formed on the first grading layer 6. In the embodiment, the tunnel layer 10 is made of GaN, and the electron supplying layer 12 is made of AlGaN. A portion of the tunnel layer 10 is doped with carbon and another portion of the tunnel layer 10 is undoped with carbon, of which the portion undoped with carbon is adjacent to the electron supplying layer 12, whereas the portion doped with carbon is far away from the electron supplying layer 12. The thickness of the portion of the tunnel layer 10 undoped with carbon is about 10~1000 nm, and preferably can be between 50~150 nm. The piezoelectric effect and polarization caused by the different lattice constants of the tunnel layer 10 and the electron supplying layer form the two-dimensional electron gas (2DEG) in the portion of the tunnel layer 10 undpoed with carbon. Since the tunnel layer 10 and the electron supplying layer 12 are the combination of GaN and AlGaN, the heterostructure formed of GaN and AlGaN has higher electron mobility and high concentration of electron carriers, which make the device formed of thereof having high power and high efficiency. And, the heterostructure of GaN/AlGaN not only provides higher electron mobility and high concentration of electron carriers, but also the power device formed of thereof is capable of working with high frequency in high voltage and high temperature. In the embodiment, the defects from the difference of lattice constants between the semiconductor layer 4 and the tunnel layer 10 can be reduced by setting the first grading layer 6 therebetween. In other words, the difference of lattice constants between the semiconductor layer 4 and the first part 106 is larger than that between the second part 107 and tunnel layer 10. Therefore, comparing with the larger lattice constant difference of the tunnel layer 10 directly formed on the semiconductor layer 4, the existence of the first grading layer 6 is able to prevent two epitaxial layers from continuously growing epitaxial layers having substantially different lattice constants so the quality of epitaxial growth is improved. As the aforementioned, the defects occurring in the first part 106 during the growth thereof are barred by the first interlayer 8 of the first grading layer 6 from extending to the second part 107 for improving the quality of the epitaxial stacking layers. In the embodiment, the tunnel layer 10 and the electron supplying layer 12 are formed of undoped semiconductor materials. In other embodiment, the tunnel layer 10 further comprises a secondary electron supplying layer (not shown in the figures) between the tunnel layer 10 and the first grading layer 6, and the material of the secondary electron supplying layer can be GaN doped with carbon or comprise same AlGaN as that of the electron supplying layer 12. The difference of lattice constants between the secondary electron supplying layer and the tunnel layer 10 can increase the effect of piezoelectric polarization and spontaneous polarization for increasing the concentration of the 2DEG in the tunnel layer 10.

Second Embodiment

Figure 2:
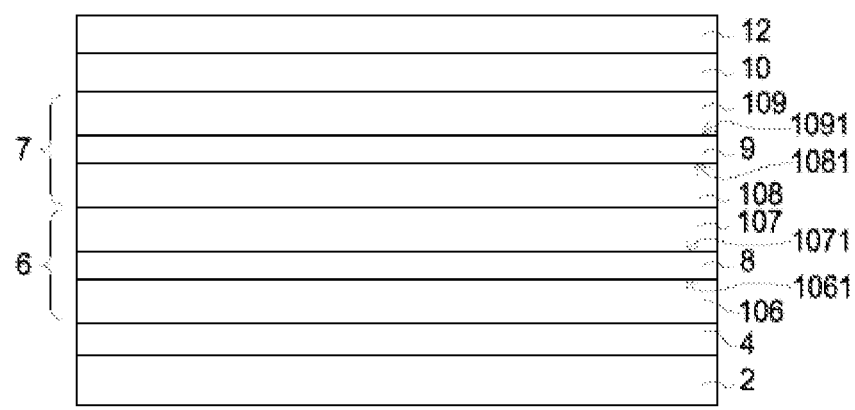
FIG. 2 shows the cross-sectional view of the semiconductor power device in accordance with the first embodiment of the present application.

As FIG. 2 shows, in another embodiment of the application, a second grading layer 7 can further be formed on the first grading layer 6, and then the tunnel layer 10 and the electron supplying layer 12 are formed on the second grading layer 7. The second grading layer 7 comprises same group III-V elements as that of the first grading layer 6. The second grading layer 7 comprises a third part 108, a fourth part 109, and a second interlayer 9 between the third part 108 and the fourth part 109, wherein the third part 108 and the fourth part 109 comprise group III-V semiconductor materials and the second interlayer 9 comprises amorphous material. In the embodiment, the second interlayer 9 is formed of SiN to bar the defects occurred in the third part 108 from extending to the fourth part 109. In other words, the third part 108 and the fourth part 109 comprising group III-V elements are separated by the second interlayer 9 devoid of the group III-V elements of the third part 108 and the fourth part 109. In other embodiment, the second interlayer 9 is devoid of group III elements or devoid of the group III elements of the third part 108 or the fourth part 109. In other embodiment, the first interlayer 8 and the second interlayer 9 can comprise the same material or different materials. In the embodiment, the third part 108 and the fourth part 109 comprise same group III-V semiconductor materials and have the same characteristic of gradual change as that the first part 106 and the second part 107. That is, in the third part 108 and the fourth part 109, the Al concentration decreases along the direction away from the substrate 2 and the Ga concentration increases along the direction away from the substrate 2. From the energy bandgap point of view, the first part 106 has higher energy bandgap than that of the second part 107 and the third part 108 has higher energy bandgap than that of the fourth part 109, and the bandgap decreases along the direction away from the substrate 2. Therefore, the first part 106 has the highest Al concentration and the fourth part 109 has the highest Ga concentration among the first part 106, the second part 107, the third part 108 and the fourth part 109, and the chemical formula of the four parts can be $Al_aGa_bN$, wherein $0<a\le1$ and $0<b\le1$. Further, the order of the Al concentration contained in the four parts is that the fourth part 109<the third part 108<the second part 107<the first part 106, and the order of the Ga concentration contained in the four parts is that the first part 106 <the second part 107<the third part 108<the fourth part 109. In other words, the range of the Al concentration contained in the second grading layer 7 is different from that in the first grading layer 6; similarly, the range of the Ga concentration contained in the second grading layer 7 is also different from that in the first grading layer 6.

In the embodiment, the second interlayer 9 of the second grading layer 7 is formed of the same amorphous material, such as SiN, as that of the first interlayer 8 of the first grading layer 6. In other embodiment, other grading layer can be further formed on the second grading layer 7, wherein the grading layer has or do not have an interlayer. After forming multiple grading layers, the tunnel layer 10 and the electron supplying layer 12 are formed on thereof. In the embodiment, the third part 108 and the fourth part 109 of the second grading layer 7 have larger lattice constant than that of the first part 106 and the second part 107 of the first grading layer 6. And, the lattice constants of the first part 106, the second part 107, the third part 108 and the fourth part 109 are between the lattice constants of the tunnel layer 10 and the semiconductor layer 4. In the embodiment, the first grading layer 6 and the second grading layer 7 comprise AlGaN. In other embodiment, the first grading layer 6 and the second grading layer 7 can also comprise AlInGaN.

In abovementioned embodiment, the semiconductor layer 4 formed of AlN is formed by importing trimethylaluminum and ammonia into a reaction chamber. Namely, the flow rate of trimethylaluminum is about 220 sccm and the flow rate of ammonia is about 1000 sccm for forming the semiconductor layer 4 formed of AlN with a thickness of 150 nm. The materials of the first grading layer 6 and the second grading layer 7 comprise group III-V semiconductor materials, such as AlGaN, wherein the Al concentration can be between 20% and 80%. In the embodiment, the first grading layer 6 and the second grading layer 7 are the grading layers formed of AlGaN which is formed by importing trimethylaluminum, trimethylgallium and ammonia into a reaction chamber. Furthermore, the compositions of these grading layers can be gradually changed by adjusting the ratio of these gases. Specifically, the first grading layer 6 and the second grading layer 7 with different compositions are formed by importing trimethylaluminum, ammonia and trimethylgallium, of which the ratio is about between 30:1:1000 and 65:25:4000, wherein the flow rate of trimethylaluminum is about 65~300 sccm, the flow rate of trimethylgallium is about 10~25 sccm, and the flow rate of ammonia is about 1000~4000 sccm. In the embodiment, the tunnel layer 10 is formed of GaN, which is grown by metal organic vapor deposition with ammonia and trimethylgallium, wherein the ratio of trimethylgallium to ammonia to be imported into the chamber is about 60:1, the flow rate of trimethylgallium is about 130 sccm and the flow rate of ammonia is about 6000 sccm, and the thickness of the tunnel layer 10 is between 25 nm and 3000 nm. A portion of the tunnel layer 10 is doped with carbon and another portion of the tunnel layer 10 is undoped with carbon, wherein the portion undoped with carbon is far away from the second grading layer 7 and the portion doped with carbon is adjacent to the second grading layer 7. The thickness of the portion of the tunnel layer 10 undoped with carbon is about 10~1000 nm, and preferably can be between 50~150 nm. In the embodiment, the flow rate of the gases imported into the reaction chamber and the ratio of the gases can be adjusted based on the requirement.

Figure 3:
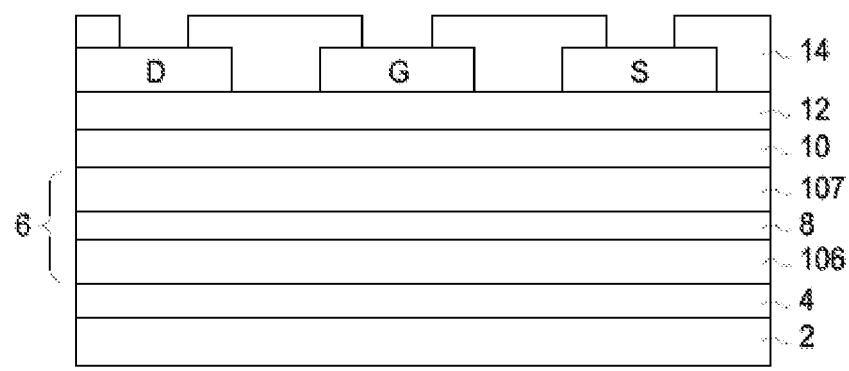
FIG. 3 shows the cross-sectional view of the semiconductor power device in accordance with the first embodiment of the present application.

As FIG. 3 shows, after forming the first grading layer 6, tunnel layer 10 and the electron supplying layer 12 in the abovementioned embodiment, an electrode D, an electrode S and an electrode G are respectively formed on the electron supplying layer 12 as terminals for electrically connecting outside device and controlling the operating mode of the power device and the electron distribution in the tunnel layer 10, wherein the materials of the electrode S, the electrode D and the electrode G can be the alloy of Ni and Au. In one embodiment, the electrode S and the electrode D form ohmically contact with the electron supplying layer 12, and the electrode G forms Schottky contact with the electron supplying layer 12. As FIG. 3 shows, after forming the abovementioned electrodes, a protective layer 14 is formed on thereof and covers the surface of the electron supplying layer 12 for preventing the surface of the electron supplying layer 12 from reacting with the imported material in the process to influence the electrical characteristic of the tunnel layer 10 and make the electrical characteristic unstable. Namely, the protective layer 14 is used for protecting the surface of the electron supplying layer 12 from outside influence that affect the composition thereof. In the embodiment, the material of the protective layer 14 can be oxide, such as $SiO_x$ or $AlO_x$, or nitride, such as $SiN_x$ or $GaN_x$. Next, the protective layer 14 is etched to reveal a portion of the electrode S, the electrode D and the electrode G for electrically connecting to outside. The protective layer 14 can cover most of the surfaces of the electrode S, the electrode D and the electrode G, and can also reveal the surfaces and the side surfaces, which is not coplanar to the surfaces, for making the outside electrical connection easier.

Figure 4:
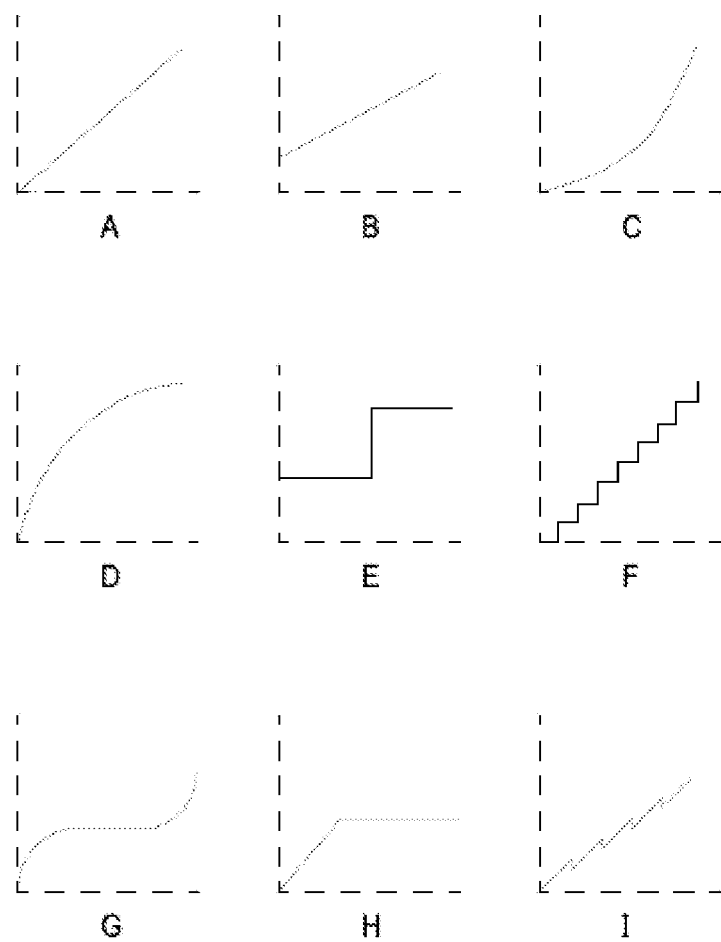
FIG. 4 shows the schematic diagrams of the distribution of gradual change in accordance with the first embodiment of the present application.

In the abovementioned embodiment, the characteristic of gradual change of AlGaN or AlGaInN of the first grading layer 6 and the second grading layer 7 can be continuous type or discontinuous type, such as stepped type. Referring to the gradual change types A to I shown in FIG. 4, the vertical direction shows the concentration of an element in the first grading layer 6 and the second grading layer 7. In the embodiment, the vertical direction represents the Ga concentration. The horizontal direction shows the distance away from the semiconductor layer 4 or the substrate 2 in the first grading layer 6 and the second grading layer 7. Therefore, all the gradual change types show that the higher Ga concentration the portion in the grading layer has, the farther away from the semiconductor layer 4 the portion in the grading layer is. In gradual change types A to D, the distribution of the Ga concentration is continuous gradual change, wherein the gradual change graph is linear or curved. In gradual change types E and F, the distributions of the Ga concentration are stepped type, wherein the difference between the two modes lies in the amount of change of the Ga concentration per unit distance, and the Ga concentration is constant in some region of the first grading layer 6 and the second grading layer 7. In gradual change type G, the distribution of the Ga concentration is constant in one region and is changed in a curve form before or after the region. In gradual change type H, the Ga concentration begins increasing linearly and keeps constant after reaching a certain level. Thus, the Ga concentration does not increase after the region. In gradual change type I, the distribution of the Ga concentration is gradually changed in a jag form, namely, following a region where the Ga concentration increases to a certain level, the Ga concentration is decreased in the adjacent region, and the aforementioned pattern is repeated several times. Furthermore, in the jag form, the region where the Ga concentration is increased is larger than the region where the Ga concentration is decreased. Namely, in the first grading layer 6 and the second grading layer 7, as the portion is away from the semiconductor layer 4, the region where the Ga concentration is increased is larger than the region where the Ga concentration is decreased, thus the further the portion is away from the semiconductor layer 4, the higher Ga concentration the portion has. In these gradual change types, it is not necessary that the minimum value of distribution of the concentration is equal to zero. For example, in gradual change types B and E, in the portion of which the distance away from the semiconductor layer 4 is zero, the concentration is not equal to zero. And, in the gradual change types, it is not necessary that the gradual change begins from the portion of which the distance away from the semiconductor layer 4 is zero. For example, in the gradual change type F, the concentration begins to change from the portion away from the semiconductor layer 4 for a distance. In the other embodiment, the gradual change types shown in FIG. 4 does not limit the description of the gradual change types of the Ga concentration respectively in the first grading layer 6 and the grading layer 7. For example, the distribution of the Ga concentration in the first grading layer 6 can be the gradual change type A, and the distribution of the Ga concentration in the second grading layer 7 can be the gradual change type H; or the distributions of the Ga concentration in both of the first grading layer 6 and in the second grading layer 7 are the gradual change type B. Namely, the distributions of the Ga concentration in the first grading layer 6 and in the second grading layer 7 comprise the same or different gradual change types. In other embodiment, the gradual change types shown in FIG. 4 can be the distribution of the Ga concentration from the first grading layer 6 to the second grading layer 7. For example, the distribution of the Ga concentration can be the gradual change type H.

Third Embodiment

Figure 5:
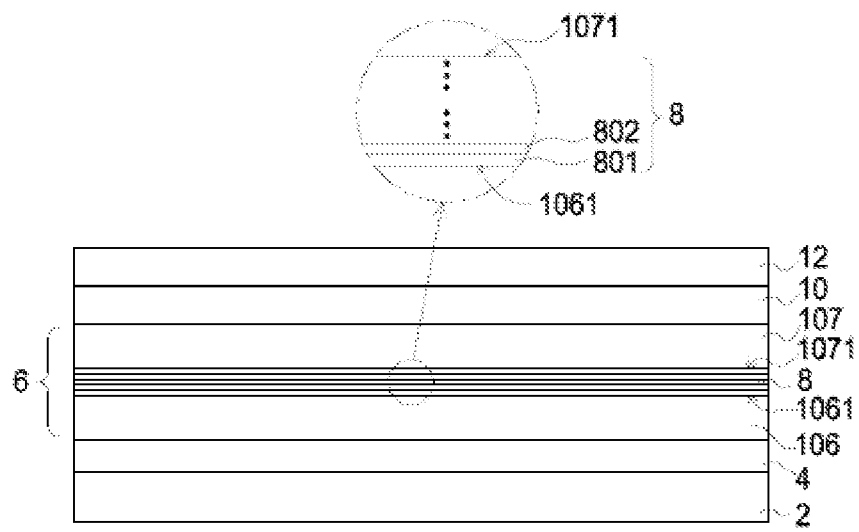
FIG. 5 shows the cross-sectional view of the semiconductor power device in accordance with another embodiment of the present application.

As FIG. 5 shows, the difference between the third embodiment and the abovementioned first embodiment is that the first interlayer 8 comprises a superlattice including a series of alternate $Al_xGa_{1-x}N$ layer 801/$Al_yGa_{1-y}N$ layer 802, and |x-y|≥0.2, wherein the thickness of $Al_{x1}Ga_{1-x1}N$ layer 801/$Al_{y1}Ga_{1-y1}N$ layer 802 is between 1 nm and 100 nm, the $Al_xGa_{1-x}N$ layer 801 is closer to the semiconductor layer 4 than the $Al_yGa_{1-y}N$ layer 802, and the series of alternate $Al_xGa_{1-x}N$ layer 801/$Al_yGa_{1-y}N$ layer 802 starts from $Al_xGa_{1-x}N$ layer 801 adjacent to the first part 106. The first part 106 and the second part 107 of the first grading layer 6 respectively have an first interface 1061 and a second interface 1071 adjacent to the first interlayer 8, wherein the portion of first part 106 near the first interface 1061 is formed of $Al_aGa_{1-a}N$, and the portion of the second part 107 near the second interface 1071 is formed of $Al_bGa_{1-b}N$, wherein the relationship of a and b can be a =b or a ≠b. In another embodiment, the relationship of x, y, a and b can be x >a =b >y, a >x >y >b, or x >a >b >y.

Figure 6:
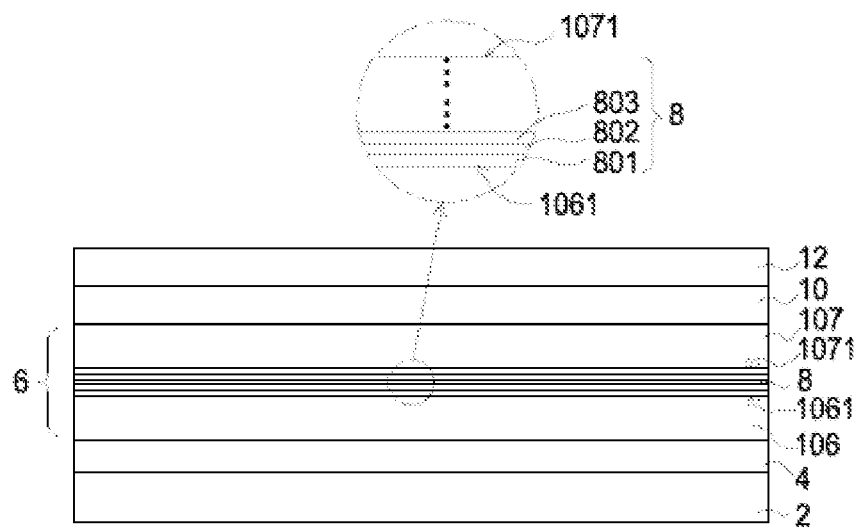
FIG. 6 shows the cross-sectional view of the semiconductor power device in accordance with still another embodiment of the present application.

FIG. 6 shows another embodiment, wherein the first interlayer 8 comprises a series of alternate $Al_xGa_{1-x}N$ layer 801/$Al_yGa_{1-y}N$ layer 802/$Al_zGa_{1-z}N$ layer 803, and |x-y|≥0.2, |y-z|≥0.2, wherein the $Al_xGa_{1-x}N$ layer 801 is the closest to the semiconductor layer 4 and the $Al_zGa_{1-z}N$ layer 803 is the farthest away from the semiconductor layer 4 among the $Al_xGa_{1-x}N$ layer 801/$Al_yGa_{1-y}N$ layer 802/$Al_zGa_{1-z}N$ layer 803, and the series of alternate $Al_xGa_{1-x}N$ layer 801/$Al_yGa_{1-y}N$ layer 802/$Al_zGa_{1-z}N$ layer 803 starts from $Al_xGa_{1-x}N$ layer 801 adjacent to the first part 106. In another embodiment, the relationship of x, y, z, a and b can be x>a=b≥y>z, x>y≥a=b>z, a>x>y>z>b, x>a>b≥y>z, x>a≥y>b >z, or x>y ≥a>b>z.

Fourth Embodiment

Figure 7:
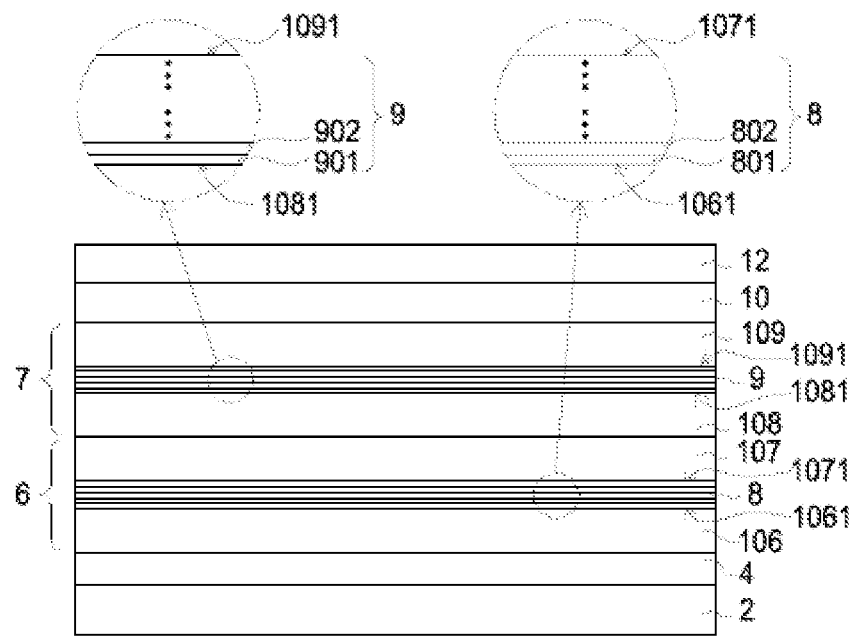
FIG. 7 shows the cross-sectional view of the semiconductor power device in accordance with yet another embodiment of the present application.

As FIG. 7 shows, the difference between the fourth embodiment and the abovementioned second embodiment is that both of the first interlayer 8 and the second interlayer 9 comprise superlattices respectively. The first interlayer 8 includes a series of alternating $Al_{x1}Ga_{1-x1}N$ layer 801/$Al_{y1}Ga_{1-y1}N$ layer 802, |x1-y1|≥0.2, wherein the $Al_{x1}Ga_{1-x1}N$ layer 801 is closer to the semiconductor layer 4 than the $Al_{y1}Ga_{1-y1}N$ layer 802, and the series of alternate $Al_{x1}Ga_{1-x1}N$ layer 801/$Al_{y1}Ga_{1-y1}N$ layer 802 starts from $Al_{x1}Ga_{1-x1}N$ layer 801 adjacent to the first part 106. The second interlayer 9 includes a series of alternating $Al_{x2}Ga_{1-x2}N$ layer 901/$Al_{y2}Ga_{1-y2}N$ layer 902, |x2-y2|≥0.2, wherein the $Al_{x2}Ga_{1-x2}N$ layer 901 is closer to the semiconductor layer 4 than the $Al_{y2}Ga_{1-y2}N$ layer 902, and the series of alternate $Al_{x2}Ga_{1-x2}N$ layer 901/$Al_{y2}Ga_{1-y2}$ layer 902 starts from $Al_{x2}Ga_{1-x2}N$ layer 901 adjacent to the third part 108. In another embodiment, the average of x1 and y1 can be larger than that of x2 and y2.

The first part 106 and the second part 107 of the first grading layer 6 respectively have a first interface 1061 and a second interface 1071 adjacent to the first interlayer 8, wherein the portion of first part 106 near the first interface 1061 is formed of $Al_aGa_{1-a}N$, and the portion of the second part 107 near the second interface 1071 is formed of $Al_bGa_{1-b}N$, wherein the relationship of a and b can be a=b or a≠b. In other embodiment, the relationship of x1, y1, a and b can be x1>a=b>y1, a>x1>y1>b, or x1>a>b>y1.

The third part 108 and the fourth part 109 of the second grading layer 7 respectively have an third interface 1081 and a fourth interface 1091 adjacent to the second interlayer 9, wherein the portion of the third part 108 near the third interface 1081 is formed of $Al_cGa_{1-c}N$, and the portion of the fourth part 109 near the fourth interface 1091 is formed of $Al_dGa_{1-d}N$, wherein the relationship of c and d can be c=d or c≠d. In other embodiment, the relationship of x2, y2, c and d can be x2>c=d>y2, c>x2>y2>d, or x2>c>d>y2.

Figure 8:
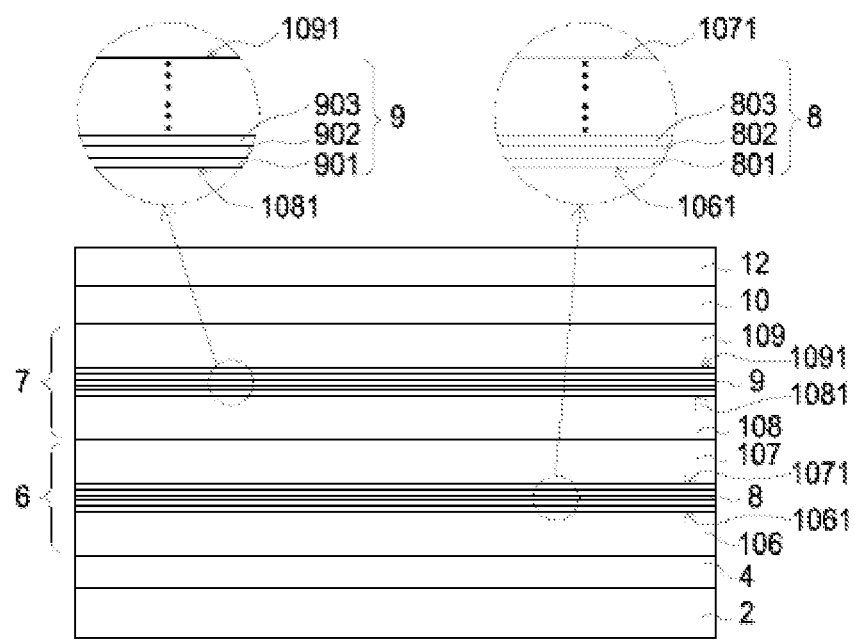
FIG. 8 shows the cross-sectional view of the semiconductor power device in accordance with a further embodiment of the present application.

FIG. 8 shows another embodiment, the first interlayer 8 comprises a first series of alternating $Al_{x1}Ga_{1-x1}N$ layer 801/ $Al_{y1}Ga_{1-y1}N$ layer 802/$Al_{z1}Ga_{1-z1}N$ layer 803, |x1-y1|≥0.2, |y1-z1|0.2, wherein the $Al_{x1}Ga_{1-x1}N$ layer 801 is the closest to the semiconductor layer 4 and the $Al_{z1}Ga_{1-z1}N$ layer 803 is the farthest away from the semiconductor layer 4 among the $Al_{x1}Ga_{1-x1}N$ layer 801/$Al_{y1}Ga_{1-y1}N$ layer 802/$Al_{z1}Ga_{1-z1}N$ layer 803, and the series of alternate $Al_{x1}Ga_{1-x1}N$ layer 801/ $Al_{y1}Ga_{1-y1}N$ layer 802/$Al_{z1}Ga_{1-z1}N$ layer 803 starts from $Al_{x1}Ga_{1-x1}N$ layer 801 adjacent to the first part 106. The second interlayer 9 comprises a second series of alternate $Al_{x2}Ga_{1-x2}N$ layer 901/$Al_{y2}Ga_{1-y2}N$ layer 902/$Al_{z2}Ga_{1-z2}N$ layer 903, |x2-y2|≥0.2, |y2-z2|0.2, wherein the $Al_{x2}Ga_{1-x2}N$ layer 901 is the closest to the semiconductor layer 4 and the $Al_{z2}Ga_{1-z2}N$ layer 903 is the farthest away from the semiconductor layer 4 among the $Al_{x2}Ga_{1-x2}N$ layer 901/$Al_{y2}Ga_{1-y2}N$ layer 902/$Al_{z2}Ga_{1-z2}N$ layer 903, and the series of alternate $Al_{x2}Ga_{1-x2}N$ layer 901/$Al_{y2}Ga_{1-y2}N$ layer 902/$Al_{z2}Ga_{1-z2}N$ layer 903 starts from $Al_{x2}Ga_{1-x2}N$ layer 901 adjacent to the third part 108. In one embodiment, the average of x1, y1 and z1 is larger than that of x2, y2 and z2. In another embodiment, the relationship of x1, y1, z1, a and b can be x1>a =b ≥y1>z1, x1>y1≥a =b >z1, a>x1>y1>z1>b, x1>a >b≥y1>z1, x1>a >y1>b >z1, or x1>y1≥a >b >z1. The relationship of x2, y2, z2, c and d can be x2>c =d ≥y2>z2, x2>y2≥c =d >z2, c >x2>y2>z2>d, x2>c>d≥y2>z2, x2>c >y2>d >z2, or x2>y2≥c >d >z2.

As being understood by a person skilled in the art, the foregoing preferred embodiments of the present application are illustrated of the present application rather than limiting of the present application. It is intended to cover various modifications and similar arrangements included within the spirit and scope of the appended claims, the scope of which should be accorded the broadest interpretation so as to encompass all such modifications and similar structure.

What is claimed is:

1. A semiconductor power device, comprising:
   a substrate;
   a first semiconductor layer with a first lattice constant formed on the substrate;
   a first grading layer formed on the first semiconductor layer and comprising a first portion;
   a second grading layer formed on the first grading layer;
   a second semiconductor layer with a second lattice constant formed on the second grading layer;
   a first interlayer formed in the first grading layer and adjacent to the first portion of the first grading layer; and
   a second interlayer formed in the second grading layer;
   wherein the first interlayer comprises a first superlattice including a series of $Al_{x1}Ga_{1-x1}N/Al_{y1}Ga_{1-y1}N$ alternate layers, (x1-y1)≥0.2, and the second interlayer comprises a second superlattice including a series of $Al_{x2}Ga_{1-x2}N/Al_{y2}Ga_{1-y2}N$ alternate layers, (x2-y2≥0.2, wherein the average of x1 and y1 is larger than that of x2 and y2.

2. The semiconductor power device according to claim 1, wherein the thickness of the $Al_{x1}Ga_{1-x1}N/Al_{y1}Ga_{1-y1}N$ layer is between 1 nm and 100 nm.

3. The semiconductor power device according to claim 1, wherein the first grading layer further comprises a second portion opposite to the first portion adjacent to the first interlayer.

4. The semiconductor power device according to claim 3, wherein the first portion and the second portion comprise $Al_aGa_{1-a}N$ and $Al_bGa_{1-b}N$ respectively, and x>a=b>y.

5. The semiconductor power device according to claim 3, wherein the first portion and the second portion comprise $Al_aGa_{1-a}N$ and $Al_bGa_{1-b}N$ respectively, and a>x>y>b, or x>a>b>y.

6. The semiconductor power device according to claim 1, wherein the first lattice constant is smaller than the second lattice constant.

7. The semiconductor power device according to claim 1, wherein the first interlayer has a lattice constant, and the lattice constant is between the first lattice constant and the second lattice constant.

8. The semiconductor power device according to claim 1, wherein the first grading layer and the second grading layer comprise AlGaN or AlGaInN, and the first interlayer and the second interlayer comprise an amorphous material.

9. The semiconductor power device according to claim 8, wherein the amorphous material comprises SiN.

10. The semiconductor power device according to claim 1, wherein the first semiconductor layer comprises a first group III element, the second semiconductor layer comprises a second group III element, the first grading layer comprises the first group III element and the second group III element, and concentrations of both the first group III element and the second group III element in the first grading layer are gradually changed.

11. The semiconductor power device according to claim 10, wherein the second grading layer comprises the first group III element and the second group III element, wherein concentrations of both of the first group III element and the second group III element in the second grading layer are gradually changed.

12. The semiconductor power device according to claim 11, wherein a lattice constant of the second grading layer is larger than the lattice constant of the first grading layer.

13. The semiconductor power device according to claim 1, wherein the $Al_{x1}Ga_{1-x1}N$ layer is closer to the substrate than the $Al_{y1}Ga_{1-y1}N$ layer.

* * * * *